(12) United States Patent
Kruger et al.

(10) Patent No.: US 6,788,540 B2
(45) Date of Patent: Sep. 7, 2004

(54) OPTICAL TRANSCEIVER CAGE

(75) Inventors: Bruce P. Kruger, Oronoco, MN (US);
Gary Heitkamp, Rochester, MN (US);
Scott Michael Branch, Rochester, MN (US)

(73) Assignee: JDS Uniphase Corporation, San Jose, CA (US)

( * ) Notice: Subject to any disclaimer, the term of this patent is extended or adjusted under 35 U.S.C. 154(b) by 9 days.

(21) Appl. No.: 10/352,820

(22) Filed: Jan. 28, 2003

(65) Prior Publication Data

US 2003/0141090 A1 Jul. 31, 2003

Related U.S. Application Data

(60) Provisional application No. 60/352,740, filed on Jan. 30, 2002, and provisional application No. 60/397,630, filed on Jul. 23, 2002.

(51) Int. Cl.[7] .............................................. H05K 7/20
(52) U.S. Cl. ...................... 361/719; 165/80.3; 165/185; 174/16.3; 174/35 R; 174/35 C; 257/719; 257/726; 361/720; 361/690; 361/706; 361/710; 361/818; 385/88; 385/92; 398/164; 439/607; 439/567
(58) Field of Search ............................... 165/80.2–80.3, 165/185; 174/16.3, 35 R, 35 C, 35 GC; 257/718–719, 726–727; 361/690–721, 736, 740, 759, 799, 816, 818; 385/75, 88–92; 398/166; 439/607–610, 352, 357, 696, 567, 571, 572, 541.5, 79

(56) References Cited

U.S. PATENT DOCUMENTS

| | | | |
|---|---|---|---|
| 5,767,999 A | | 6/1998 | Kayner ........................ 359/163 |
| 6,062,893 A | * | 5/2000 | Miskin et al. ............... 439/374 |
| 6,419,523 B1 | | 7/2002 | Jones et al. .................. 439/607 |
| 6,483,711 B1 | * | 11/2002 | Huang ......................... 361/736 |
| 6,524,134 B2 | * | 2/2003 | Flickinger et al. .......... 439/607 |
| 6,558,191 B2 | * | 5/2003 | Bright et al. ............. 439/541.5 |
| 6,672,901 B2 | * | 1/2004 | Schulz et al. ............... 439/607 |

* cited by examiner

*Primary Examiner*—Gregory D. Thompson
(74) *Attorney, Agent, or Firm*—Allen, Dyer, Doppelt, Milbrath & Gilchrist, P.A.

(57) ABSTRACT

The present invention relates to a cage for holding an optical transceiver module in electrical contact with a host circuit board. The cage includes front, middle and rear sections, and facilitates the insertion of the optical transceiver into the cage, as well as providing electromagnetic shielding and facilitating thermal dissipation. Typically, the cage is for use with an optical transceiver module including an integral heat sink cover or with an optical transceiver module including an external heat sink mounted over top of the cage. Various embodiments illustrate different schemes for maximizing heat dissipation by providing large openings in the middle section of the cage, as well as mounting surfaces on the front and rear sections for mounting external heat sinks. One or more crossbars are provided for guiding the transceiver module during insertion.

20 Claims, 5 Drawing Sheets

OPTICAL TRANSCEIVER CAGE

CROSS-REFERENCE TO RELATED APPLICATIONS

The present invention claims priority from U.S. Patent Application No. 60/352,740 filed Jan. 30, 2002 and U.S. Patent Application No. 60/397,630 filed Jul. 23, 2002.

TECHNICAL FIELD

The present invention relates to a cage for supporting an optical transceiver on a host circuit board, and in particular to a cage providing electromagnetic interference shielding, as well as facilitating increased thermal dissipation.

BACKGROUND OF THE INVENTION

Transceiver cages provide a guide for "hot plugging" an electrical connector of an optical transceiver module into a mating electrical connector on a host circuit board. Conventional cages for the GBIC transceiver product, such as the one disclosed in U.S. Pat. No. 5,767,999 issued Jun. 16, 1998 to Vixel Corporation, and generally indicated at 1 in FIG. 1, include a plastic frame 2 with an elongated guide rail 3 for engaging a channel formed in the side of the GBIC transceiver housing to guide the transceiver into contact with the host connector. Holes 4 are provided in the frame 2 for receiving a locking detent resiliently biased outwardly from the side of the transceiver housing. A door 6, pivotally mounted on the frame 2, is resiliently biased shut to prevent dust or any other foreign matter from entering the cage 1 through the opening 7. EMI clips 8 are mounted on the frame 2 proximate the opening 7, so that spring fingers 9 extend therein. The plastic GBIC cage 1 has a completely open top, which enables the circulation of air for heat dissipation, but provides no EMI protection nor the ability to mount any additional thermally conductive surfaces for added heat dissipation. Pluggable small form factor (SFP) cages 10, such as the ones disclosed in U.S. Pat. No. 6,419,523 issued Jul. 16, 2002 to Hon Hai Precision Ind. Co. and illustrated in FIG. 2, completely surround the transceiver module except for a few holes 12 in the top 11, thereby eliminating the need for a guide rail, while providing good EMI protection. A resilient flange 13 is provided for locking the transceiver module into the cage 10. The top 11, the base 14 and the sides 15 are provided with spring fingers 16 for grounding the cage 10 to the host device chassis. Pins 17 are provide for securing the cage 10 to the host circuit board. Unfortunately, the amount of heat dissipation is greatly reduced, as air flow over the transceiver module is limited. Moreover, since the transceiver module is completely enclosed, no additional thermally conductive surfaces can be mounted thereto for added heat dissipation.

Recently developed higher power transceivers, e.g. transmitting at 10 Gb/s, require both EMI protection and the ability to dissipate larger amounts of heat. Therefore, the cages developed for the new transceivers need to provide both good EMI shielding and facilitate the dissipation of heat.

An object of the present invention is to overcome the shortcomings of the prior art by providing an optical transceiver cage with a simple guiding feature, good EMI protection, and with the ability to dissipate excess heat.

SUMMARY OF THE INVENTION

Accordingly, the present invention relates to a metal cage mountable on a circuit board of a grounded host device for receiving an optical transceiver therein comprising:

a front shroud, having a base, two sidewalls and a top, defining an opening for receiving the optical transceiver during installation, and for surrounding a front portion of the optical transceiver during use;

a rear shroud, including: an open bottom, for receiving an electrical connector mounted on the circuit board; two sidewalls; and a top, the two sidewalls and the top for surrounding a rear portion of the optical transceiver during use;

a middle section extending between the front and rear shrouds having a base, two sidewalls and a substantially open top; and at least one cross bar extending from the top of the front shroud to the top of the rear shroud for guiding the optical transceiver during installation.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
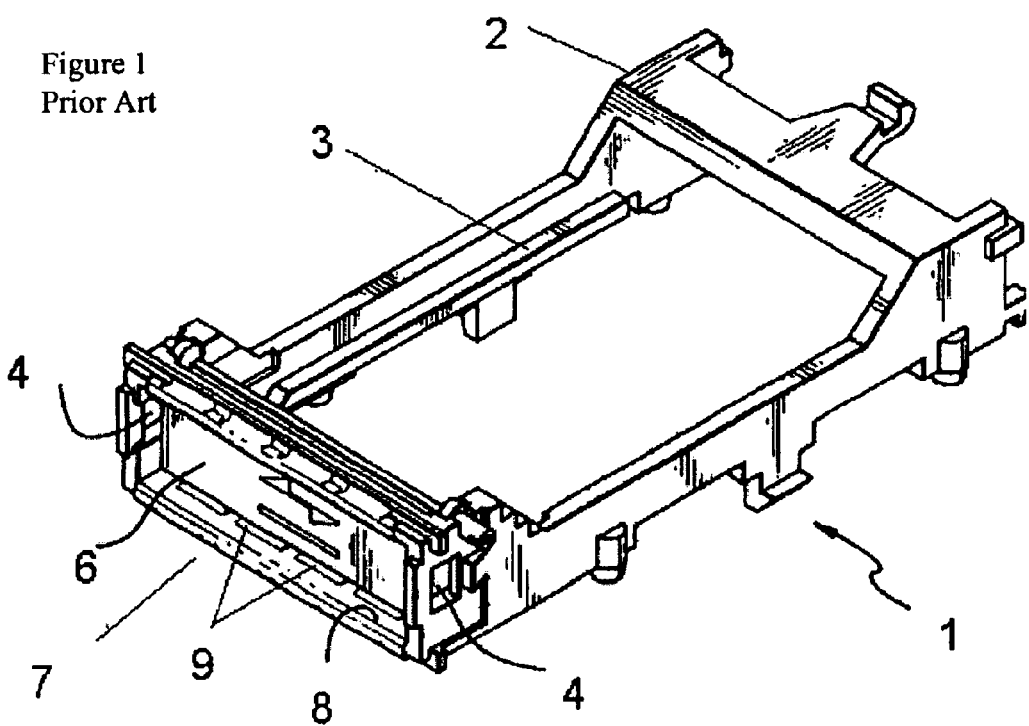
FIG. 1 is an isometric view of a conventional optical transceiver cage for a GBIC transceiver.
Figure 2:
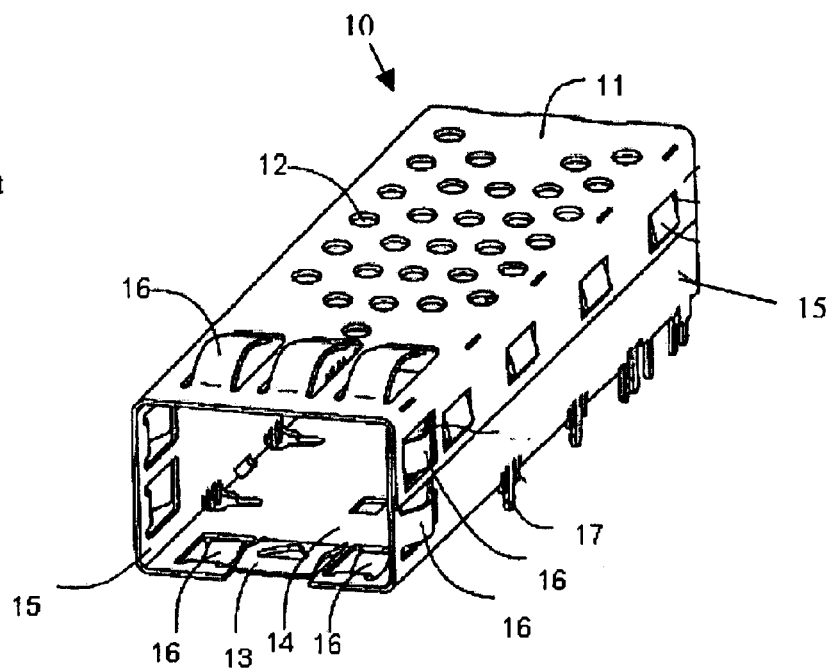
FIG. 2 is an isometric view of a conventional optical transceiver cage for a SFP transceiver.
Figure 3:
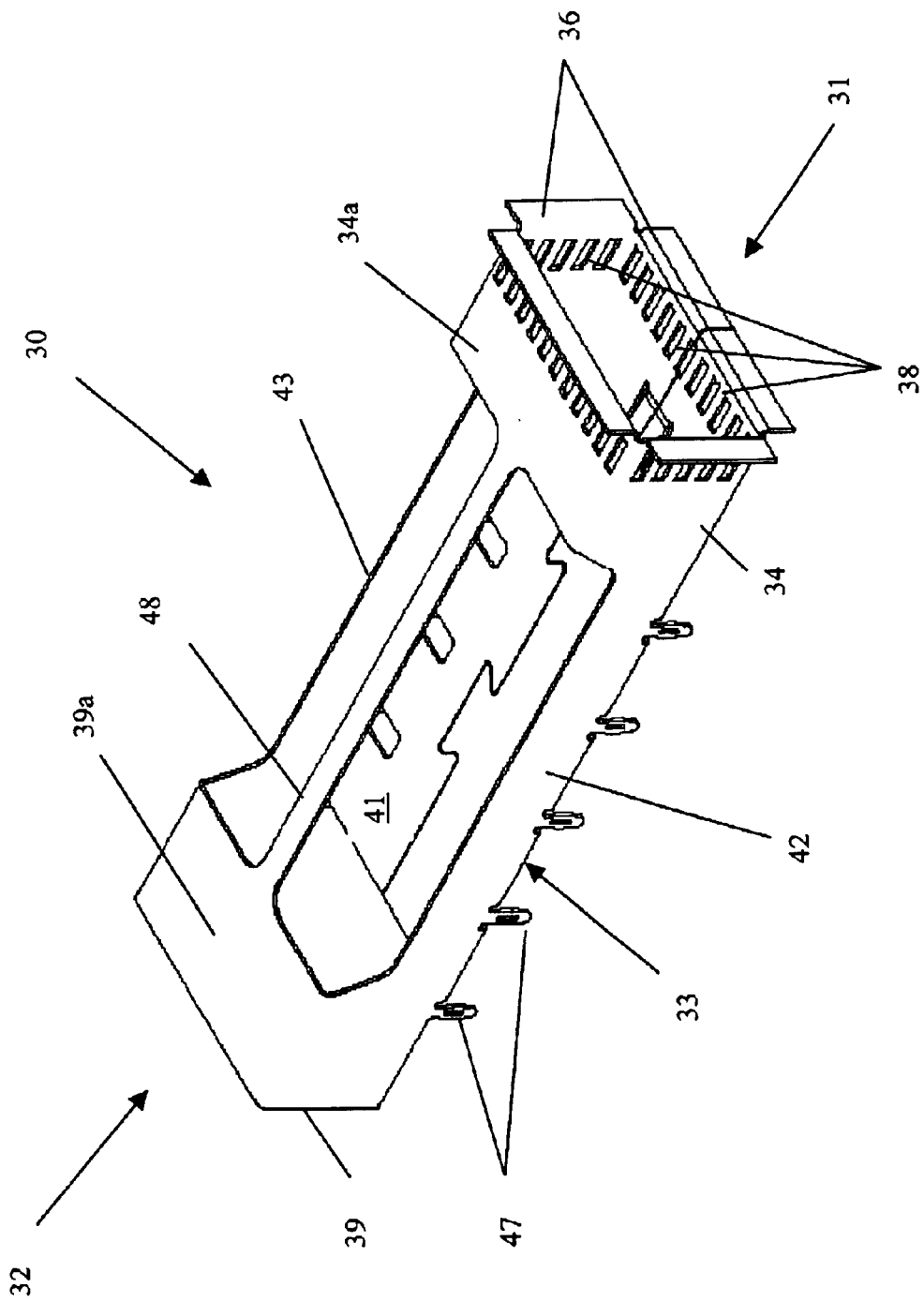
FIG. 3 is an isometric view of an optical transceiver cage according to the present invention.
Figure 4:
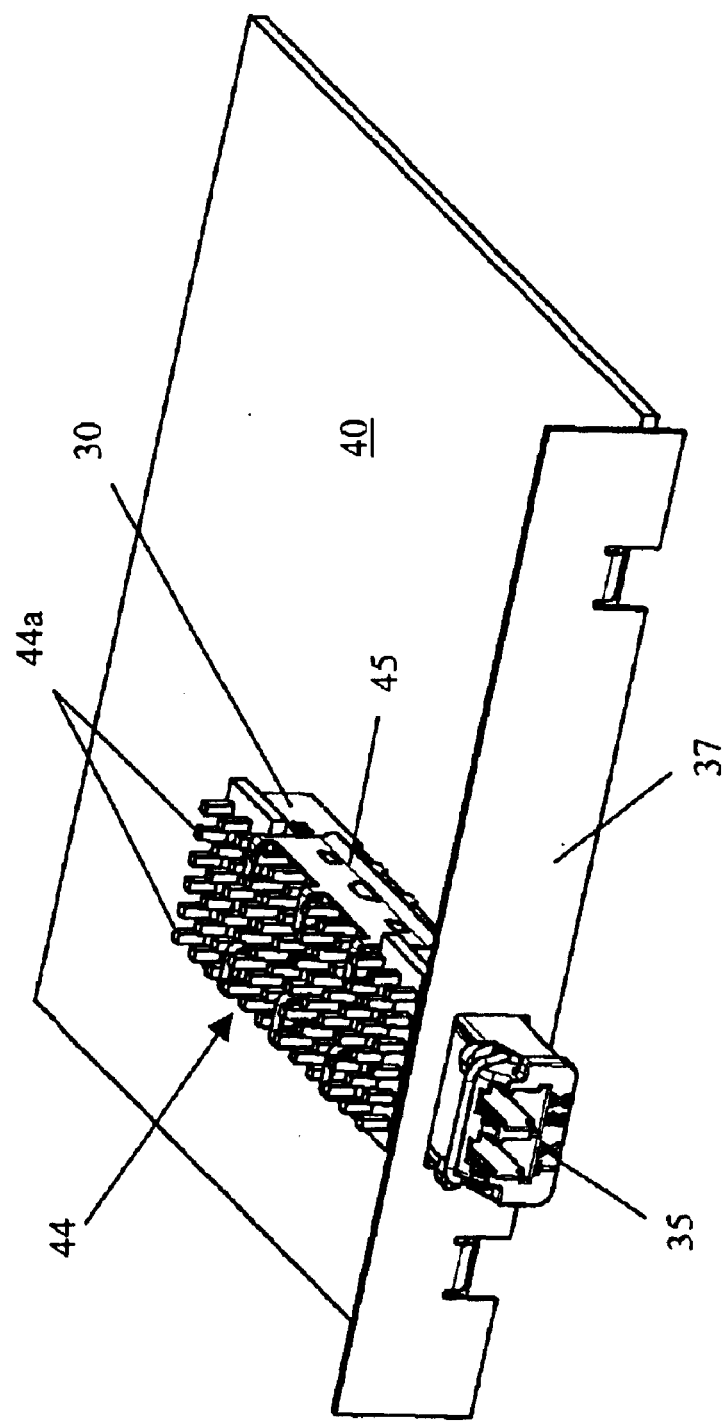
FIG. 4 is an isometric view of the optical transceiver cage according to the present invention mounted on a circuit board with a transceiver installed therein.

With reference to FIGS. 3 and 4, an optical transceiver cage made of a conductive metal, generally indicated at 30, includes a front end indicated at 31, a back end indicated at 32, and a middle section indicated at 33. The front end 31 includes a front shroud 34 defining a generally rectangular opening for receiving an optical transceiver module 35 (FIG. 4). In use, the front shroud 34 surrounds the front part of the optical transceiver module 35 providing EMI shielding. Conductive flanges 36 extend outwardly from the sides of the front shroud 34 for contacting a grounding faceplate 37 (FIG. 4) of a host device. Arcuately bent spring fingers 38, which extend from the conductive flanges 36, are resiliently biased into the opening for contacting the optical transceiver 35 while positioned in the cage 30. The conductive flanges 36 and the spring fingers 38 provide an electrical path from the housing of the optical transceiver to the grounded host device for electro-static discharge and to prevent EMI from leaking from the cage.

The back end 32 includes a rear shroud 39 defining an opening in the bottom thereof for receiving an electrical connector, which transmits the electrical signals between the optical transceiver's electrical connector and the host circuit board 40. In use, the rear shroud 39 substantially surrounds the rear part of the optical transceiver module 35, in particular the electrical connectors, providing EMI shielding.

The middle section 33 includes a base 41 and sidewalls 42 and 43, contiguous with the front and rear shrouds 34 and 39. In the embodiment illustrated in FIG. 3 the sidewalls 42 and 43 do not extend upwardly as high as the sides of the shrouds 34 and 39. Accordingly, when the transceiver module 35 includes a heat dissipating cover with pins or fins (See FIG. 5), air will more easily be able to flow over the cover and through the pins or fins. Alternatively, as in FIG. 4, the sidewalls 42 and 43 may extend upwardly as high as the sides of the shrouds 36 and 39, and a separate heat dissipating element 44 acting as a heat sink may be placed over top of the cage 30 in contact with the transceiver module 35. The upper walls 34a and 39a of the front and rear shrouds 34 and 39, respectively, provide a mounting surface for the separate heat dissipating element 44. Separate clips 45 may be used to ensure that the heat dissipating element 44 is held tightly on the transceiver module 35. Spring flaps (best seen in FIG. 5) are provided on the sides of the middle section 33 for interlocking with openings in one end of the clips 45. The other end of the clips 45 is comprised of a plurality of elongated spring fingers which extend between the heat dissipating projections 44a for biasing the heat dissipating element 44 down onto the transceiver 35. Pins 47 extend downwardly from the base 41 for securing the cage 30 to the host circuit board 40.

The upper walls 34a and 39a of the front and rear shrouds 34 and 39 are interconnected by one or more elongated cross bars 48. The cross bar 48 provides a guide for the optical transceiver 35 as it is inserted into the cage 30. The cross bar 48 can be provided down the middle of the cage 30, as illustrated in FIG. 3, or one or more cross bars 48 can be provided at various convenient locations, if necessary. The opening provided in the middle section 33 ensures adequate air flow over the body of the transceiver 35 or access to the top of the transceiver module 35 for contact with the separate heat dissipating element 44. In use, when the optical transceiver module 35 includes a heat dissipating cover (as in FIG. 5) with a plurality of heat dissipating projections, e.g. pins or fins, the cover provides the necessary thermal requirements and EMI shielding. Alternatively, when the separate heat dissipating element 44 is secured above the cage 30 in contact with the housing of the optical transceiver 35, the separate heat dissipating element 44 would close in the openings in the middle section 33 to provide the necessary heat dissipation and EMI shielding.

Figure 5:
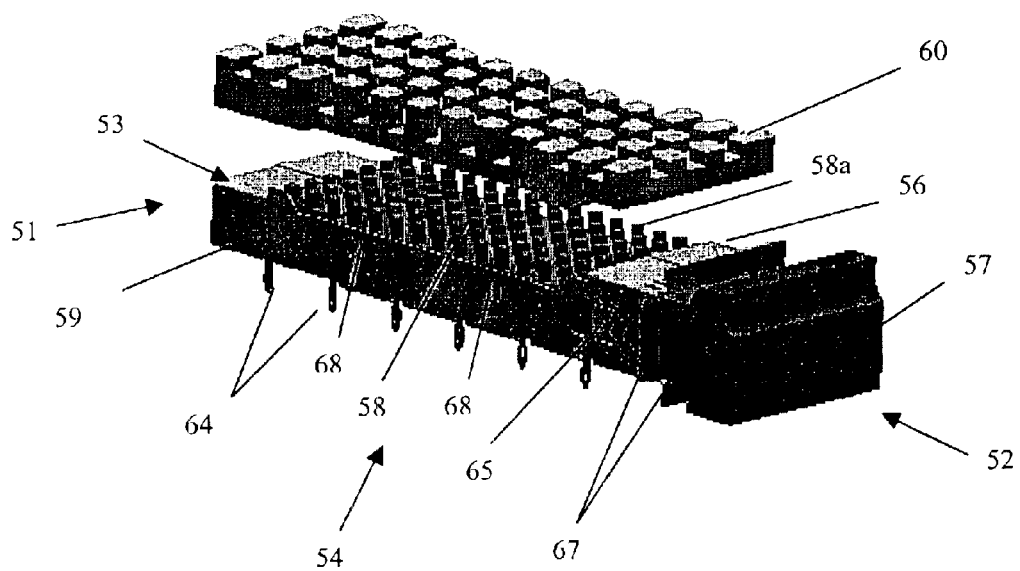
FIG. 5 is an isometric view of another embodiment of an optical transceiver cage according to the present invention with a transceiver module mounting therein.

FIG. 5 illustrates another embodiment of the present invention, in which a cage 51 includes a front end 52, a back end 53 and a middle section 54. A front shroud 56 has a wide opening large enough to receive the transceiver module 57 with an integral heat dissipating cover 58. A rear shroud 59 is somewhat smaller than the front shroud 56 as the rear portion of the transceiver module 57 does not extend upwardly as high as the heat dissipating cover 58. Accordingly sidewalls of the middle section 54 have the same height as the sidewalls of the rear shroud 59. The front shroud 56 and the rear shroud 59 still provide mounting surfaces for an externally mounted heat sink 60, which includes recesses in the underside thereof for receiving the pins 58a from the heat dissipating cover 58. As before, pins 64 are provided for mounting the cage 51 to the host circuit board. The cage 51 also includes conductive flanges 67 for grounding the cage 51 to the grounded host's faceplate. Rectangular spring arms 65, resiliently biased into the cage 51, are provided for locking the transceiver module 57 in the cage 51. Preferably the spring arms 65 are integrally manufactured in the sides of the front shroud 56. Spring flaps 68 are provided on the sides of the middle section 54 for interlocking with one end of the separate clips (see FIG. 4). Preferably, the spring flaps 68 are integral with the middle section 54. A cross bar and the separate clips have been omitted from this figure for simplicity, although they are preferably provided. A cross bar would extend over top of the heat dissipating cover 58 or would slide in a channel between rows of the pins 58a. The cross bar can be provided down the middle of the cage 51 or in one or more convenient locations in the opening formed in the middle section 54.

We claim:

1. A metal cage mountable on a circuit board of a grounded host device for receiving an optical transceiver therein comprising:
    a front shroud, having a base, two sidewalls and a top, defining an opening for receiving the optical transceiver during installation, and for surrounding a front portion of the optical transceiver during use;
    a rear shroud, including: an open bottom, for receiving an electrical connector mounted on the circuit board; two sidewalls; and a top, the two sidewalls and the top for surrounding a rear portion of the optical transceiver during use;
    a middle section extending between the front and rear shrouds having a base, two sidewalls and a substantially open top; and
    at least one cross bar extending from the top of the front shroud to the top of the rear shroud for guiding the optical transceiver during installation.

2. The cage according to claim 1, wherein the sidewalls of the front shroud extend higher than the two sidewalls of the middle section, whereby air is able to flow over the two sidewalls of the middle section and over the optical transceiver mounted therebetween.

3. The cage according to claim 1, wherein the sidewalls of the front and rear shrouds extend higher than the two sidewalls of the middle section, whereby air is able to flow over the two sidewalls of the middle section and over the optical transceiver mounted therebetween.

4. The cage according to claim 1, wherein the top of the front shroud and the top of the rear shroud both include a mounting surface for supporting an externally mounted heat sink.

5. The cage according to claim 4, further comprising an externally mounted heat sink for mounting on the mounting surfaces in contact with the optical transceiver to dissipate heat therefrom.

6. The cage according to claim 5, wherein the externally mounted heat sink includes recesses in a lower surface thereof for receiving heat dissipating projections extending from the optical transceiver.

7. The cage according to claim 5, further comprising a clip for holding the heat sink on the optical transceiver.

8. The cage according to claim 7, further comprising interlocking means on said middle section for interlocking with one end of said clip; wherein the other end of said clip biases said heat sink onto the optical transceiver.

9. The cage according to claim 2, wherein the top of the front shroud and the top of the rear shroud both include a mounting surface for supporting an externally mounted heat sink.

10. The cage according to claim 3, wherein the top of the front shroud and the top of the rear shroud both include a mounting surface for supporting an externally mounted heat sink.

11. The cage according to claim 1, further comprising conductive flanges mounted proximate the opening of the front shroud for contacting a faceplate of the grounded host device; and spring fingers biased into the opening of the front shroud for contacting the optical transceiver during insertion for the prevention of electromagnetic interference leakage.

12. The cage according to claim 1, further comprising a spring arms resiliently biased into the cage for engagement with the optical transceiver to lock the optical transceiver in the cage.

13. The cage according to claim 1, wherein the front shroud includes a spring arm for extending into contact with the optical transceiver to lock the optical transceiver module in the cage.

14. An optical transceiver assembly comprising an optical transceiver and a metal cage mountable on a circuit board of a grounded host device for receiving the optical transceiver therein;

wherein the metal cage comprises:
a front shroud, having a base, two sidewalls and a top, defining an opening for receiving the optical transceiver during installation, and for surrounding a front portion of the optical transceiver during use;
a rear shroud, including: an open bottom, for receiving an electrical connector mounted on the circuit board; two sidewalls; and a top, the two sidewalls and the top for surrounding a rear portion of the optical transceiver during use;
a middle section extending between the front and rear shrouds having a base, two sidewalls and a substantially open top; and
at least one cross bar extending from the top of the front shroud to the top of the rear shroud for guiding the optical transceiver during installation.

15. The optical transceiver assembly according to claim 14, wherein the sidewalls of the front shroud extend higher than the sidewalls of the middle section, whereby air is able to flow over the two sidewalls of the middle section and over the optical transceiver mounted therebetween.

16. The optical transceiver assembly according to claim 14, wherein the top of the front shroud and the top of the rear shroud both include a mounting surface for supporting an externally mounted heat sink.

17. The optical transceiver assembly according to claim 16, further comprising an externally mounted heat sink for mounting on the mounting surfaces in contact with the optical transceiver to dissipate heat therefrom.

18. The optical transceiver assembly according to claim 17, wherein the optical transceiver includes heat dissipating projections extending therefrom; and wherein the externally mounted heat sink includes recesses in a lower surface thereof for receiving the heat dissipating projections.

19. The optical transceiver assembly according to claim 14, further comprising a spring arm resiliently biased into the cage for engagement with the optical transceiver to lock the optical transceiver in the cage.

20. The optical transceiver assembly according to claim 17, further comprising a clip for holding the externally mounted heat sink on the optical transceiver.

* * * * *